United States Patent
Luo et al.

(10) Patent No.: US 10,997,328 B2
(45) Date of Patent: May 4, 2021

(54) METHOD AND APPARATUS FOR SIMULATION TEST OF AUTONOMOUS DRIVING OF VEHICLES, AN APPARATUS AND COMPUTER-READABLE STORAGE MEDIUM

(71) Applicant: BEIJING BAIDU NETCOM SCIENCE AND TECHNOLOGY CO., LTD., Beijing (CN)

(72) Inventors: Dun Luo, Beijing (CN); Qian Dou, Beijing (CN); Jing Wang, Beijing (CN); Qingrui Sun, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 400 days.

(21) Appl. No.: 15/914,996

(22) Filed: Mar. 7, 2018

(65) Prior Publication Data

US 2018/0268092 A1 Sep. 20, 2018

(30) Foreign Application Priority Data

Mar. 15, 2017 (CN) .......................... 201710153360.9

(51) Int. Cl.
*G06F 30/20* (2020.01)
*G05B 17/02* (2006.01)
(Continued)

(52) U.S. Cl.
CPC ............. *G06F 30/20* (2020.01); *G05B 17/02* (2013.01); *G05D 1/0088* (2013.01); *G06F 30/15* (2020.01)

(58) Field of Classification Search
CPC ............. G01C 21/3492; G01C 21/3691; G01C 21/3469; G06Q 10/04; G06F 30/15;
(Continued)

(56) References Cited

U.S. PATENT DOCUMENTS 9,412,278 B1 * 8/2016 Gong .................... G08G 5/0091
9,755,850 B2 * 9/2017 Stolfus .................. H04L 43/062
(Continued)

FOREIGN PATENT DOCUMENTS

| CN | 102982703 A | 3/2013 |
| CN | 105679030 A | 6/2016 |
| CN | 105956268 A | 9/2016 |

OTHER PUBLICATIONS

First Office Action and Search Report from CN app. No. 201710153360. 9, dated Sep. 26, 2019, with English translation from Global Dossier.

(Continued)

*Primary Examiner* — Kandasamy Thangavelu
(74) *Attorney, Agent, or Firm* — Ladas & Parry, LLP (57) ABSTRACT

The present disclosure provides a method and apparatus for simulation test of autonomous driving of a vehicle, an apparatus and a computer-readable storage medium. In embodiments of the present disclosure, a simulation-activating command is sent to the at least two simulation nodes so that each simulation node in the at least two simulation nodes simulates the designated traffic environment and runs the corresponding vehicle decision planning algorithm, then the vehicle state data and the vehicle decision route of said each simulation node are obtained so that the vehicle state data and the vehicle decision route of said each simulation node can be output. Since a plurality of simulation nodes are employed to simultaneously simulate the designated traffic environment and run the corresponding vehicle decision planning algorithm, it is possible to, in completely the same simulated traffic environment, simultaneously run a plurality of vehicles having the autonomous driving function, and visually compare the vehicle decision planning algorithm
(Continued)

run by each simulation node, and thereby perform the check processing for the vehicle decision planning algorithm.

13 Claims, 2 Drawing Sheets

(51) Int. Cl.
    *G05D 1/00* (2006.01)
    *G06F 30/15* (2020.01)
(58) Field of Classification Search
    CPC ....... G06F 30/20; H04W 4/80; G08G 1/0415; G08G 5/0013; G08G 5/0091; G05D 1/0088; B60W 40/09; G07C 5/0808; G05B 17/02; G09B 19/0053; G01S 7/497; B60R 25/252
    See application file for complete search history.

(56) References Cited

U.S. PATENT DOCUMENTS

| | | | | |
|---|---|---|---|---|
| 9,964,414 | B2 * | 5/2018 | Slavin | G01C 21/3492 |
| 10,042,359 | B1 * | 8/2018 | Konrardy | B60R 25/252 |
| 10,309,792 | B2 * | 6/2019 | Iagnemma | G01C 21/3461 |
| 2002/0133329 | A1 * | 9/2002 | Kano | G06F 30/15 |
| | | | | 703/22 |
| 2011/0060425 | A1 | 3/2011 | Freed | |
| 2017/0090478 | A1 * | 3/2017 | Blayvas | G06Q 10/04 |
| 2017/0356751 | A1 * | 12/2017 | Iagnemma | G01C 21/3691 |
| 2018/0017964 | A1 * | 1/2018 | Li | H04W 4/80 |
| 2018/0141544 | A1 * | 5/2018 | Xiao | G01S 7/497 |
| 2018/0188051 | A1 * | 7/2018 | Gaspard-Boulinc | |
| | | | | G01C 21/3469 |
| 2019/0019418 | A1 * | 1/2019 | Tantardini | G08G 5/0013 |

OTHER PUBLICATIONS

Geng Tian "Research on Bionic Lane-changing Decision-making Model for Autonomous Vehicle under Dynamic Urban Environment", Beijing Institute of Technology, Jan. 7, 2016.
Yu Xin, "Research on Methods in Dynamic Obstacles Detection, Prediction and Avoidance of Autonomous Vehicles", University of Science and Technology of China, May 8, 2014.
Lan Yun et al., "Research on rule editing and code generation for the high-level decision system of unmanned vehicles", Computer Engineering and Science, vol. 37, No. 8, Aug. 31, 2015.
Tao Zhang et al., "A Novel Platform for Simulation and Evaluation of Intelligent Behavior of Driverless Vehicle", Proceedings of the 2008 IEEE International Conference on Vehicular Electronics and Safety, Columbus, OH, USA, Sep. 22-24, 2008.

* cited by examiner

METHOD AND APPARATUS FOR SIMULATION TEST OF AUTONOMOUS DRIVING OF VEHICLES, AN APPARATUS AND COMPUTER-READABLE STORAGE MEDIUM

The present application claims priority to Chinese Patent Application 201710153360.9, filed on Mar. 15, 2017, with the title of "Method and apparatus for simulation test of autonomous driving of vehicles, an apparatus and computer-readable storage medium", the disclosure of which is hereby incorporated by reference in its entirety.

FIELD OF THE DISCLOSURE

The present disclosure relates to simulation test technologies, and particularly to a method and apparatus for simulation test of autonomous driving of a vehicle, an apparatus and a computer-readable storage medium.

BACKGROUND OF THE DISCLOSURE

At present, since people's living standards improve, transportation vehicles such as cars become people's main walk-replacing tools. Intelligentization of transportation vehicles makes travel simpler and simpler. In some cases, vehicles may automatically perform the driving task, for example, the vehicles may be vehicles such as ordinary household cars, public transportation vehicles and trucks on which autonomous driving function is activated, or may be vehicles such as driverless household cars, public transportation vehicles and trucks. Upon performing autonomous driving, vehicles need to obtain a vehicle decision route according to a pre-configured vehicle decision planning algorithm, and then perform the autonomous driving task according to the vehicle decision route.

To ensure safety of vehicle autonomous driving, it is desirable to provide a simulation test method to perform check processing for the vehicle decision planning algorithm.

SUMMARY OF THE DISCLOSURE

A plurality of aspects of the present disclosure provide a method and apparatus for simulation test of autonomous driving of a vehicle, an apparatus and a computer-readable storage medium, to perform check processing for the vehicle decision planning algorithm.

According to an aspect of the present disclosure, there is provided a method for simulation test of autonomous driving of a vehicle, comprising:

sending a simulation-activating command to at least two simulation nodes so that each simulation node in the at least two simulation nodes simulates a designated traffic environment and runs a corresponding vehicle decision planning algorithm;

obtaining vehicle state data and a vehicle decision route of said each simulation node;

outputting the vehicle state data and the vehicle decision route of said each simulation node.

The above aspect and any possible implementation mode further provide an implementation mode: before sending a simulation-activating command to at least two simulation nodes, the method further comprises:

obtaining a simulated travel log of the designated traffic environment and a vehicle decision planning algorithm of said each simulation node;

configuring the simulated travel log of the designated traffic environment and the corresponding vehicle decision planning algorithm to said each simulation node.

The above aspect and any possible implementation mode further provide an implementation mode: after sending the simulation-activating command to at least two simulation nodes so that each simulation node in the at least two simulation nodes simulates the designated traffic environment and runs the corresponding vehicle decision planning algorithm, the method further comprises:

storing the vehicle state data and vehicle decision route of said each simulation node in a storage device of a terminal in real time.

The above aspect and any possible implementation mode further provide an implementation mode: obtaining the vehicle state data and the vehicle decision route of said each simulation node comprises:

obtaining, from the storage device of the terminal, the vehicle state data and the vehicle decision route of said each simulation node.

The above aspect and any possible implementation mode further provide an implementation mode:

outputting the vehicle state data and the vehicle decision route of said each simulation node comprises:

outputting the vehicle state data and vehicle decision route of said each simulation node on one simulation node of the at least two simulation nodes.

According to another aspect of the present disclosure, there is provided an apparatus for simulation test of autonomous driving of a vehicle, comprising:

a configuring unit configured to send a simulation-activating command to at least two simulation nodes so that each simulation node in the at least two simulation nodes simulates a designated traffic environment and runs a corresponding vehicle decision planning algorithm;

an obtaining unit configured to obtain vehicle state data and a vehicle decision route of said each simulation node;

an outputting unit configured to output the vehicle state data and the vehicle decision route of said each simulation node.

The above aspect and any possible implementation mode further provide an implementation mode: the configuring unit is further configured to:

obtain a simulated travel log of the designated traffic environment and a vehicle decision planning algorithm of said each simulation node; and configure the simulated travel log of the designated traffic environment and the corresponding vehicle decision planning algorithm to said each simulation node.

The above aspect and any possible implementation mode further provide an implementation mode: the configuring unit is further configured to store the vehicle state data and vehicle decision route of said each simulation node in a storage device of a terminal in real time.

The above aspect and any possible implementation mode further provide an implementation mode: the obtaining unit is specifically configured to obtain, from the storage device of the terminal, the vehicle state data and the vehicle decision route of said each simulation node.

The above aspect and any possible implementation mode further provide an implementation mode: the outputting unit is specifically configured to output the vehicle state data and the vehicle decision route of said each simulation node on one simulation node of the at least two simulation nodes.

According to a further aspect of the present disclosure, there is provided an apparatus, comprising
one or more processors;
a storage device for storing one or more programs;
the one or more programs, when being executed by the one or more processors, enable the one or more processors to implement the method for simulation test of autonomous driving of a vehicle as stated in the first aspect.

According to a further aspect of the present disclosure, there is provided a computer-readable storage medium on which a computer program is stored, the program, when executed by a processor, implementing the method for simulation test of autonomous driving of a vehicle as stated in the first aspect.

As known from the above technical solutions, in embodiments of the present disclosure, the simulation-activating command is sent to the at least two simulation nodes so that each simulation node in the at least two simulation nodes simulates the designated traffic environment and runs the corresponding vehicle decision planning algorithm, then the vehicle state data and the vehicle decision route of said each simulation node are obtained so that the vehicle state data and the vehicle decision route of said each simulation node can be output. Since a plurality of simulation nodes are employed to simultaneously simulate the designated traffic environment and run the corresponding vehicle decision planning algorithm, it is possible to, in completely the same simulated traffic environment, simultaneously run a plurality of vehicles having the autonomous driving function, and visually compare the vehicle decision planning algorithm run by each simulation node, and thereby perform the check processing for the vehicle decision planning algorithm.

In addition, using the technical solutions provided by the present disclosure can, in completely the same simulated traffic environment, simultaneously run a plurality of vehicles having the autonomous driving function, and visually compare the vehicle decision planning algorithm run by each simulation node without individually running each vehicle having the autonomous driving function, and can effectively improve the check processing efficiency of the vehicle decision planning algorithm.

In addition, the technical solutions according to the present disclosure can be employed to effectively ensure reliability and safety of vehicle autonomous driving.

BRIEF DESCRIPTION OF DRAWINGS

To describe technical solutions of embodiments of the present disclosure more clearly, figures to be used in the embodiments or in depictions regarding the prior art will be described briefly. Obviously, the figures described below are only some embodiments of the present disclosure. Those having ordinary skill in the art appreciate that other figures may be obtained from these figures without making inventive efforts.

DETAILED DESCRIPTION OF PREFERRED EMBODIMENTS

To make objectives, technical solutions and advantages of embodiments of the present disclosure clearer, technical solutions of embodiment of the present disclosure will be described clearly and completely with reference to figures in embodiments of the present disclosure. Obviously, embodiments described here are partial embodiments of the present disclosure, not all embodiments. All other embodiments obtained by those having ordinary skill in the art based on the embodiments of the present disclosure, without making any inventive efforts, fall within the protection scope of the present disclosure.

It needs to be appreciated that the terminals involved in the embodiments of the present disclosure comprise but are not limited to a mobile phone, a Personal Digital Assistant (PDA), a wireless handheld device, a tablet computer, a Personal Computer (PC), an MP3 player, an MP4 player, and a wearable device (e.g., a pair of smart glasses, a smart watch, or a smart bracelet).

In addition, the term "and/or" used in the text is only an association relationship depicting associated objects and represents that three relations might exist, for example, A and/or B may represents three cases, namely, A exists individually, both A and B coexist, and B exists individually. In addition, the symbol "/" in the text generally indicates associated objects before and after the symbol are in an "or" relationship.

Figure 1:
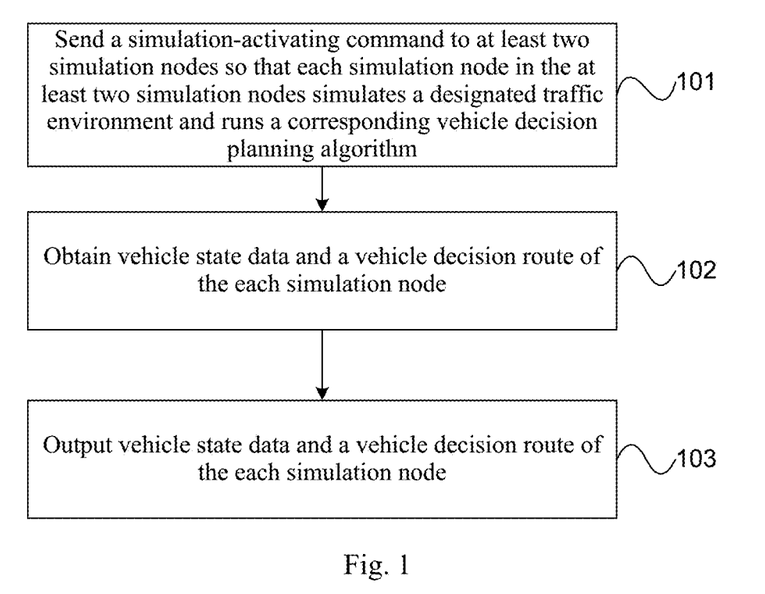
FIG. 1 is a flow chart of a method of simulation test of autonomous driving of a vehicle according to an embodiment of the present disclosure.

FIG. 1 is a flow chart of a method of simulation test of autonomous driving of a vehicle according to an embodiment of the present disclosure. As shown in FIG. 1, 101: sending a simulation-activating command to at least two simulation nodes so that each simulation node in the at least two simulation nodes simulates a designated traffic environment and runs a corresponding vehicle decision planning algorithm.

In the present disclosure, the word "designated" in the designated traffic environment does not a special meaning, and is intended to designate the current testing environment, hence, the designated traffic environment is an ordinary traffic environment, for example, a real traffic environment on a certain road segment.

102: obtaining vehicle state data and a vehicle decision route of said each simulation node.

103: outputting the vehicle state data and the vehicle decision route of said each simulation node.

As such, it is feasible to perform check processing such as comparison processing and analysis processing based on the output vehicle state data and the vehicle decision route of said each simulation node.

In the present disclosure, the designated traffic environment simulated by said each simulation node may be further output. In the designated traffic environment, it is possible to more visually output the output vehicle state data and the vehicle decision route of said each simulation node.

It needs to be appreciated that subjects for executing 101-103 may partially or totally be an application located in a local terminal, or a function unit such as a plug-in or Software Development Kit (SDK) located in an application of the local terminal, or a processing engine located in a network-side server, or a distributed type system located on the network side. This is not particularly limited in the present embodiment.

It may be understood that the application may be a native application (nativeAPP) installed on the terminal, or a web program (webApp) of a browser on the terminal. This is not particularly limited in the present embodiment.

As such, the simulation-activating command is sent to the at least two simulation nodes so that each simulation node in the at least two simulation nodes simulates the designated traffic environment and runs the corresponding vehicle decision planning algorithm, then the vehicle state data and the vehicle decision route of said each simulation node are obtained so that the vehicle state data and the vehicle decision route of said each simulation node can be output. Since a plurality of simulation nodes are employed to simultaneously simulate the designated traffic environment and run the corresponding vehicle decision planning algorithm, it is possible to, in completely the same simulated traffic environment, simultaneously run a plurality of vehicles having the autonomous driving function, and visually compare the vehicle decision planning algorithm run by each simulation node, and thereby perform the check processing for the vehicle decision planning algorithm.

In the present disclosure, the employed plurality of simulation nodes may be understood as run applications, which may run on the same device or on a plurality of devices. Since the same designated traffic environment is simulated on each simulation node, vehicles that simulate autonomous driving on each simulation node are invisible from one another, thereby ensuring reliability of the simulation data.

Optionally, in a possible implementation mode of the present embodiment, in 101, it is feasible to further perform a configuration operation of each simulation node.

In a specific implementation procedure, it is specifically possible to obtain a simulated travel log of the designated traffic environment, and then configure the simulated travel log of the designated traffic environment to said each simulation node.

The so-called simulated travel log of the designated traffic environment means traffic environment data employed in a real traffic environment, for example, obstacle data, vehicle data, pedestrian data, bicycle data and the like. These traffic environment data may be played back to restore the real traffic environment for simulation test.

In another specific implementation procedure, it is specifically possible to the vehicle decision planning algorithm of said each simulation node, and then configure the corresponding vehicle decision planning algorithm to said each simulation node.

It needs to be appreciated that the vehicle decision planning algorithm configured to each simulation node may be the same decision planning algorithm or different decision planning algorithms. This is not specifically limited in the present embodiment.

As such, after each simulation node is configured with the simulated travel log of the designated traffic environment and the respective vehicle decision planning algorithm, once the simulation-activation command is received, it is possible to consider the simulated travel log of the designated traffic environment as input of the vehicle decision planning algorithm, and run the vehicle decision planning algorithm. When each simulation node runs the vehicle decision planning algorithm, the vehicle state data and vehicle decision route of the simulation node may be obtained.

Optionally, in a possible implementation mode of the present embodiment, in 101, it is specifically feasible to run an activation script to achieve sending the simulation-activating command to at least two simulation nodes.

Optionally, in a possible implementation mode of the present embodiment, it is further possible, after obtaining the vehicle state data and vehicle decision route of each simulation node, store the vehicle state data and vehicle decision route of said each simulation node in a storage device of a terminal in real time.

Specifically, after obtaining the vehicle state data and vehicle decision route of each simulation node, each simulation node stores the obtained vehicle state data and vehicle decision route of the simulation node in a storage device of a terminal in real time.

In a specific implementation procedure, the storage device of the terminal may be a slow speed storage device, and may specifically be a hard disk of a computer system, or a non-running memory, namely, a physical memory of a mobile phone, for example, a Read-Only Memory (ROM) or a memory card. This is not particularly limited in the present embodiment.

In another specific implementation procedure, the storage device of the terminal may be a fast speed storage device, and may specifically be a memory of a computer system, or a running memory, namely, a system memory of a mobile phone, for example, a Random Access Memory (RAM). This is not particularly limited in the present embodiment.

In a further specific implementation procedure, the storage device of the terminal may further be an application run by the terminal, for example, a software program having a buffering capability or storage capability such as Redis.

Optionally, in a possible implementation mode of the present embodiment, in 102, the vehicle state data and the vehicle decision route of said each simulation node may be specifically obtained from the storage device of the terminal.

Specifically, after each simulation node writes the obtained vehicle state data and vehicle decision route of the simulation node into the storage device of the terminal in real time, it is feasible to read, from the storage device of the terminal, the stored vehicle state data and vehicle decision route of each simulation node in real time.

As such, using the storage technology can obtain the vehicle state data and vehicle decision route of each simulation node in real time, and then perform comparison processing for these data in real time, needless to record the simulation data of each stimulation node and then perform the comparison processing, thereby effectively improving the comparison processing efficiency of the simulation data, and meanwhile substantially reducing human power costs.

Optionally, in a possible implementation mode of the present embodiment, in 103, it is specifically possible to output the vehicle state data and vehicle decision route of said each simulation node on one simulation node of the at least two simulation nodes, or output the vehicle state data and vehicle decision route of said each simulation node on other nodes except the at least two stimulation nodes, or output the vehicle state data and vehicle decision route of said each simulation node on an individual display device. This is not particularly limited in the present embodiment.

In the present embodiment, the simulation-activating command is sent to the at least two simulation nodes so that each simulation node in the at least two simulation nodes simulates the designated traffic environment and runs the corresponding vehicle decision planning algorithm, then the vehicle state data and the vehicle decision route of said each simulation node are obtained so that the vehicle state data and the vehicle decision route of said each simulation node can be output. Since a plurality of simulation nodes are employed to simultaneously simulate the designated traffic environment and run the corresponding vehicle decision planning algorithm, it is possible to, in completely the same simulated traffic environment, simultaneously run a plurality of vehicles having the autonomous driving function, and visually compare the vehicle decision planning algorithm run by each simulation node, and thereby perform the check processing for the vehicle decision planning algorithm.

In addition, using the technical solution provided by the present disclosure can, in completely the same simulated traffic environment, simultaneously run a plurality of vehicles having the autonomous driving function, and visually compare the vehicle decision planning algorithm run by each simulation node without individually running each vehicle having the autonomous driving function, and can effectively improve the check processing efficiency of the vehicle decision planning algorithm.

In addition, the technical solution according to the present disclosure can be employed to effectively ensure reliability and safety of vehicle autonomous driving.

As appreciated, for ease of description, the aforesaid method embodiments are all described as a combination of a series of actions, but those skilled in the art should appreciated that the present disclosure is not limited to the described order of actions because some steps may be performed in other orders or simultaneously according to the present disclosure. Secondly, those skilled in the art should appreciate the embodiments described in the description all belong to preferred embodiments, and the involved actions and modules are not necessarily requisite for the present disclosure.

In the above embodiments, different emphasis is placed on respective embodiments, and reference may be made to related depictions in other embodiments for portions not detailed in a certain embodiment.

Figure 2:
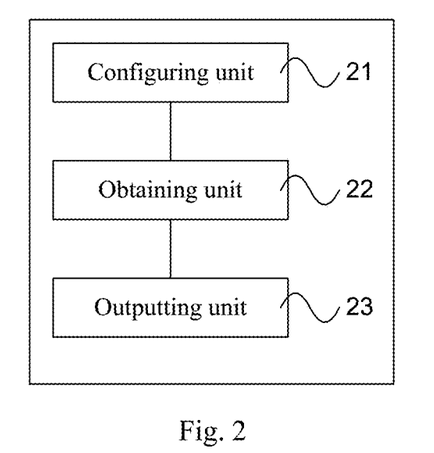
FIG. 2 is a block diagram of an apparatus for simulation test of autonomous driving of a vehicle according to another embodiment of the present disclosure.

FIG. 2 is a block diagram of an apparatus for simulation test of autonomous driving of a vehicle according to another embodiment of the present disclosure. As shown in FIG. 2, the apparatus for simulation test of autonomous driving of a vehicle according to the embodiment may comprise a configuring unit 21, an obtaining unit 22 and an outputting unit 23, wherein the configuring unit 21 is configured to send a simulation-activating command to at least two simulation nodes so that each simulation node in the at least two simulation nodes simulates a designated traffic environment and runs a corresponding vehicle decision planning algorithm; the obtaining unit 22 is configured to obtain vehicle state data and a vehicle decision route of said each simulation node; the outputting unit 23 is configured to output the vehicle state data and the vehicle decision route of said each simulation node.

It needs to be appreciated that apparatus for simulation test of autonomous driving of a vehicle according to the embodiment may partially or totally be an application located in a local terminal, namely, a terminal equipment on the designated transportation vehicle, or a function unit such as a plug-in or Software Development Kit (SDK) located in an application of the local terminal, or a processing engine located in a network-side server, or a distributed type system located on the network side. This is not particularly limited in the present embodiment.

It may be understood that the application may be a native application (nativeAPP) installed on the terminal, or a web program (webApp) of a browser on the terminal. This is not particularly limited in the present embodiment.

Optionally, in a possible implementation mode of the present embodiment, the configuring unit 21 may be further configured to obtain a simulated travel log of the designated traffic environment and a vehicle decision planning algorithm of said each simulation node, and then configure the simulated travel log of the designated traffic environment and the corresponding vehicle decision planning algorithm to said each simulation node.

Optionally, in a possible implementation mode of the present embodiment, the configuring unit 21 may be further configured to store the vehicle state data and vehicle decision route of said each simulation node in a storage device of a terminal in real time.

Optionally, in a possible implementation mode of the present embodiment, the obtaining unit 22 is specifically configured to obtain, from the storage device of the terminal, the vehicle state data and vehicle decision route of said each simulation node.

Optionally, in a possible implementation mode of the present embodiment, the outputting unit 23 is specifically configured to output the vehicle state data and vehicle decision route of said each simulation node on one simulation node of the at least two simulation nodes.

It needs to be appreciated that the method in the embodiment corresponding to FIG. 1 may be implemented by the apparatus for simulation test of autonomous driving of the vehicle according to the present embodiment. Reference may be made to relevant contents in the embodiment corresponding to FIG. 1 for detailed description, which will not be detailed any longer here.

In the present embodiment, the configuring unit sends the simulation-activating command to the at least two simulation nodes so that each simulation node in the at least two simulation nodes simulates the designated traffic environment and runs the corresponding vehicle decision planning algorithm, then the obtaining unit obtains the vehicle state data and the vehicle decision route of said each simulation node so that the outputting unit can output the vehicle state data and the vehicle decision route of said each simulation node. Since a plurality of simulation nodes are employed to simultaneously simulate the designated traffic environment and run the corresponding vehicle decision planning algorithm, it is possible to, in completely the same simulated traffic environment, simultaneously run a plurality of vehicles having the autonomous driving function, and visually compare the vehicle decision planning algorithm run by each simulation node, and thereby perform the check processing for the vehicle decision planning algorithm.

In addition, using the technical solution provided by the present disclosure can, in completely the same simulated traffic environment, simultaneously run a plurality of vehicles having the autonomous driving function, and visually compare the vehicle decision planning algorithm run by each simulation node without individually running each vehicle having the autonomous driving function, and can effectively improve the check processing efficiency of the vehicle decision planning algorithm.

In addition, the technical solution according to the present disclosure can be employed to effectively ensure reliability and safety of vehicle autonomous driving.

Figure 3:
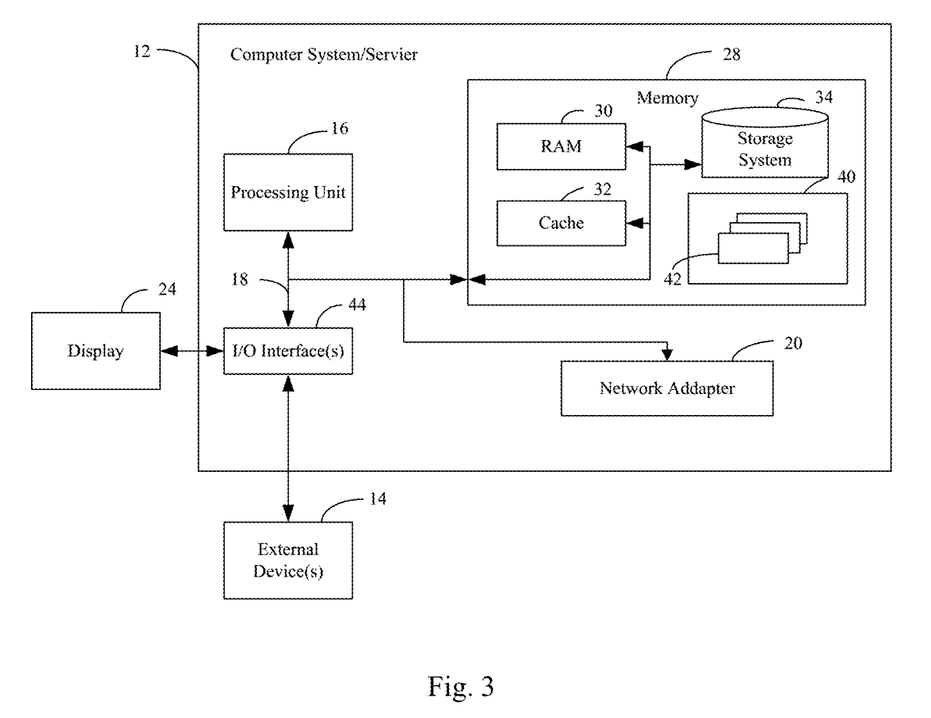
FIG. 3 is a block diagram of an exemplary computer system/server 12 adapted to implement the embodiment of the present disclosure.

FIG. 3 illustrates a block diagram of an example computer system/server 12 adapted to implement an implementation mode of the present disclosure. The computer system/server 12 shown in FIG. 3 is only an example and should not bring about any limitation to the function and scope of use of the embodiments of the present disclosure.

As shown in FIG. 3, the computer system/server 12 is shown in the form of a general-purpose computing device. The components of computer system/server 12 may include, but are not limited to, one or more processors (processing units) 16, a memory 28, and a bus 18 that couples various system components including system memory 28 and the processor 16.

Bus 18 represents one or more of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

Memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown in FIG. 3 and typically called a "hard drive"). Although not shown in FIG. 3, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each drive can be connected to bus 18 by one or more data media interfaces. The memory 28 may include at least one program product having a set (e.g., at least one) of program modules that are configured to carry out the functions of embodiments of the present disclosure.

Program/utility 40, having a set (at least one) of program modules 42, may be stored in the system memory 28 by way of example, and not limitation, as well as an operating system, one or more disclosure programs, other program modules, and program data. Each of these examples or a certain combination thereof might include an implementation of a networking environment. Program modules 42 generally carry out the functions and/or methodologies of embodiments of the present disclosure.

Computer system/server 12 may also communicate with one or more external devices 14 such as a keyboard, a pointing device, a display 24, etc.; with one or more devices that enable a user to interact with computer system/server 12; and/or with any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted in FIG. 3, network adapter 20 communicates with the other communication modules of computer system/server 12 via bus 18. It should be understood that although not shown, other hardware and/or software modules could be used in conjunction with computer system/server 12. Examples, include, but are not limited to: microcode, device drivers, redundant processing units, external disk drive arrays, RAID systems, tape drives, and data archival storage systems, etc.

The processor 16 executes various function applications and data processing by running programs stored in the memory 28, for example, implement the method for simulation test of autonomous driving of a vehicle provided by the embodiment corresponding to FIG. 1.

Another embodiment of the present disclosure further provides a computer-readable storage medium on which a computer program is stored. The program, when executed by a processor, can implement the method for simulation test of autonomous driving of a vehicle provided by the embodiment corresponding to FIG. 1.

Specifically, the computer-readable medium of the present embodiment may employ any combinations of one or more computer-readable media. The machine readable medium may be a machine readable signal medium or a machine readable storage medium. A machine readable medium may include, but not limited to, an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the text herein, the computer readable storage medium can be any tangible medium that include or store programs for use by an instruction execution system, apparatus or device or a combination thereof.

The computer-readable signal medium may be included in a baseband or serve as a data signal propagated by part of a carrier, and it carries a computer-readable program code therein. Such propagated data signal may take many forms, including, but not limited to, electromagnetic signal, optical signal or any suitable combinations thereof. The computer-readable signal medium may further be any computer-readable medium besides the computer-readable storage medium, and the computer-readable medium may send, propagate or transmit a program for use by an instruction execution system, apparatus or device or a combination thereof.

The program codes included by the computer-readable medium may be transmitted with any suitable medium, including, but not limited to radio, electric wire, optical cable, RF or the like, or any suitable combination thereof.

Computer program code for carrying out operations disclosed herein may be written in one or more programming languages or any combination thereof. These programming languages include an object oriented programming language such as Java, Smalltalk, C++ or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Those skilled in the art can clearly understand that for purpose of convenience and brevity of depictions, reference may be made to corresponding procedures in the aforesaid method embodiments for specific operation procedures of the system, apparatus and units described above, which will not be detailed any more.

In the embodiments provided by the present disclosure, it should be understood that the revealed system, apparatus and method can be implemented in other ways. For example, the above-described embodiments for the apparatus are only exemplary, e.g., the division of the units is merely logical one, and, in reality, they can be divided in other ways upon implementation. For example, a plurality of units or components may be combined or integrated into another system, or some features may be neglected or not executed. In addition, mutual coupling or direct coupling or communicative connection as displayed or discussed may be indirect coupling or communicative connection performed via some interfaces, means or units and may be electrical, mechanical or in other forms.

The units described as separate parts may be or may not be physically separated, the parts shown as units may be or may not be physical units, i.e., they can be located in one place, or distributed in a plurality of network units. One can select some or all the units to achieve the purpose of the embodiment according to the actual needs.

Further, in the embodiments of the present disclosure, functional units can be integrated in one processing unit, or they can be separate physical presences; or two or more units can be integrated in one unit. The integrated unit described above can be implemented in the form of hardware, or they can be implemented with hardware plus software functional units.

Finally, it is appreciated that the above embodiments are only used to illustrate the technical solutions of the present disclosure, not to limit the present disclosure; although the present disclosure is described in detail with reference to the above embodiments, those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present disclosure.

What is claimed is:

1. A method for simulation test of autonomous driving of a vehicle, wherein the method comprises:
   sending a simulation-activating command to at least two simulation nodes so that the at least two simulation nodes simultaneously simulate a plurality of vehicles in a designated traffic environment and run a corresponding vehicle decision planning algorithm, the vehicle decision planning algorithm corresponding to each simulation node being the same decision planning algorithm or a different decision planning algorithm;
   obtaining vehicle state data and a vehicle decision route computed by each simulation node of the at least two simulation nodes for each of the plurality of vehicles;
   outputting the vehicle state data and the vehicle decision route computed by each simulation node on one simulation node of the at least two simulation nodes for each of the plurality of vehicles;
   visually comparing vehicle decision planning algorithm run by each simulation node using the vehicle state data and the vehicle decision route computed by each simulation node for each of the plurality of vehicles; and
   performing check processing of vehicle decision planning algorithm to ensure reliability and safety of vehicle autonomous driving using the vehicle state data and the vehicle decision route computed by each simulation node for each of the plurality of vehicles.

2. The method according to claim 1, wherein before sending the simulation-activating command to at least two simulation nodes, the method further comprises:
   obtaining a simulated travel log of the designated traffic environment and a vehicle decision planning algorithm of each simulation node;
   configuring the simulated travel log of the designated traffic environment and the corresponding vehicle decision planning algorithm to each simulation node.

3. The method according to claim 1, wherein after sending a simulation-activating command to at least two simulation nodes so that each simulation node in the at least two simulation nodes simulates the designated traffic environment and runs the corresponding vehicle decision planning algorithm, the method further comprises:
   storing vehicle state data and a vehicle decision route of each simulation node in a storage device of a terminal in real time.

4. The method according to claim 3, wherein obtaining vehicle state data and a vehicle decision route of each simulation node comprises:
   obtaining, from the storage device of the terminal, vehicle state data and a vehicle decision route of each simulation node.

5. An apparatus, wherein the apparatus comprises:
   one or more processors;
   a storage device for storing one or more programs;
   the one or more programs, when being executed by the one or more processors, enable the one or more processors to implement the following operation:
   sending a simulation-activating command to at least two simulation nodes so that the at least two simulation nodes simultaneously simulate a plurality of vehicles in a designated traffic environment and run a corresponding vehicle decision planning algorithm, the vehicle decision planning algorithm corresponding to each simulation node being the same decision planning algorithm or a different decision planning algorithm;
   obtaining vehicle state data and a vehicle decision route computed by each simulation node of the at least two simulation nodes for each of the plurality of vehicles;
   outputting the vehicle state data and the vehicle decision route computed by each simulation node on one simulation node of the at least two simulation nodes for each of the plurality of vehicles;
   visually comparing vehicle decision planning algorithm run by each simulation node using the vehicle state data and the vehicle decision route computed by each simulation node for each of the plurality of vehicles; and
   performing check processing of vehicle decision planning algorithm to ensure reliability and safety of vehicle autonomous driving using the vehicle state data and the vehicle decision route computed by each simulation node for each of the plurality of vehicles.

6. The apparatus according to claim 5, wherein before sending the simulation-activating command to at least two simulation nodes, the operation further comprises:
   obtaining a simulated travel log of the designated traffic environment and a vehicle decision planning algorithm of each simulation node;
   configuring the simulated travel log of the designated traffic environment and the corresponding vehicle decision planning algorithm to each simulation node.

7. The apparatus according to claim 5, wherein after sending a simulation-activating command to at least two simulation nodes so that each simulation node in the at least two simulation nodes simulates the designated traffic environment and runs the corresponding vehicle decision planning algorithm, the operation further comprises:
   storing vehicle state data and a vehicle decision route of each simulation node in a storage device of a terminal in real time.

8. The apparatus according to claim 7, wherein obtaining vehicle state data and a vehicle decision route of each simulation node comprises:
  obtaining, from the storage device of the terminal, vehicle state data and a vehicle decision route of each simulation node.

9. A non-transitory computer-readable storage medium on which a computer program is stored, wherein the program, when executed by a processor, implements the following operation:
  sending a simulation-activating command to at least two simulation nodes so that the at least two simulation nodes simultaneously simulate a plurality of vehicles in a designated traffic environment and run a corresponding vehicle decision planning algorithm, the vehicle decision planning algorithm corresponding to each simulation node being the same decision planning algorithm or a different decision planning algorithm;
  obtaining vehicle state data and a vehicle decision route computed by each simulation node of the at least two simulation nodes for each of the plurality of vehicles;
  outputting the vehicle state data and the vehicle decision route computed by each simulation node on one simulation node of the at least two simulation nodes for each of the plurality of vehicles;
  visually comparing vehicle decision planning algorithm run by each simulation node using the vehicle state data and the vehicle decision route computed by each simulation node for each of the plurality of vehicles; and
  performing check processing of vehicle decision planning algorithm to ensure reliability and safety of vehicle autonomous driving using the vehicle state data and the vehicle decision route computed by each simulation node for each of the plurality of vehicles.

10. The non-transitory computer-readable storage medium according to claim 9, wherein before sending the simulation-activating command to at least two simulation nodes, the operation further comprises:
  obtaining a simulated travel log of the designated traffic environment and a vehicle decision planning algorithm of each simulation node;
  configuring the simulated travel log of the designated traffic environment and the corresponding vehicle decision planning algorithm to each simulation node.

11. The non-transitory computer-readable storage medium according to claim 9, wherein after sending a simulation-activating command to at least two simulation nodes so that each simulation node in the at least two simulation nodes simulates the designated traffic environment and runs the corresponding vehicle decision planning algorithm, the operation further comprises:
  storing vehicle state data and a vehicle decision route of each simulation node in a storage device of a terminal in real time.

12. The non-transitory computer-readable storage medium according to claim 11, wherein obtaining vehicle state data and a vehicle decision route of each simulation node comprises:
  obtaining, from the storage device of the terminal, vehicle state data and a vehicle decision route of each simulation node.

13. The non-transitory computer-readable storage medium according to claim 9, wherein outputting the vehicle state data and the vehicle decision route of each simulation node comprises:
  outputting the vehicle state data and vehicle decision route of each simulation node on one simulation node of the at least two simulation nodes.

* * * * *